(12) United States Patent
Yoo et al.

(10) Patent No.: US 8,531,243 B2
(45) Date of Patent: Sep. 10, 2013

(54) BIAS CONTROLLING APPARATUS

(75) Inventors: Hyun Hwan Yoo, Gyeonggi-do (KR); Yoo Hwan Kim, Gyeonggi-do (KR); Yoo Sam Na, Seoul (KR)

(73) Assignee: Samsung Electro-Mechanics Co., Ltd. (KR)

( * ) Notice: Subject to any disclaimer, the term of this patent is extended or adjusted under 35 U.S.C. 154(b) by 29 days.

(21) Appl. No.: 13/370,227

(22) Filed: Feb. 9, 2012

(65) Prior Publication Data
US 2013/0082777 A1 Apr. 4, 2013

(30) Foreign Application Priority Data
Sep. 29, 2011 (KR) .................. 10-2011-0099225

(51) Int. Cl.
*H03F 3/04* (2006.01)
(52) U.S. Cl.
USPC .......................................... 330/289; 330/296
(58) Field of Classification Search
USPC ................ 330/289, 207 P, 285, 296, 288
See application file for complete search history.

(56) References Cited

U.S. PATENT DOCUMENTS

| 7,009,453 B2* | 3/2006 | Kuriyama | 330/289 |
| 7,310,015 B2* | 12/2007 | Jeon et al. | 327/538 |
| 7,948,320 B2* | 5/2011 | Splithof et al. | 330/296 |
| 8,063,623 B2 | 11/2011 | Negoi et al. | |
| 8,390,363 B2* | 3/2013 | Engl | 327/512 |
| 8,427,227 B2* | 4/2013 | Horie et al. | 327/513 |
| 2009/0315532 A1 | 12/2009 | Negoi et al. | |

FOREIGN PATENT DOCUMENTS

| KR | 1996-0039083 | 11/1996 |
| KR | 1020000024781 A | 5/2000 |
| KR | 10-2002-0083193 A | 11/2002 |
| KR | 10-2011-0068074 A | 6/2011 |

\* cited by examiner

*Primary Examiner* — Henry Choe
(74) *Attorney, Agent, or Firm* — Blakely Sokoloff Taylor & Zafman (57) ABSTRACT

The present invention includes: a temperature compensation circuit for generating a digital signal corresponding to a temperature of a transistor and outputting a compensation bias current obtained by adding a control current to a reference bias current or by subtracting the control signal from the reference bias current using the generated digital signal; a characteristics compensation circuit for detecting a characteristics error of a mirror transistor connected to the transistor in parallel and for outputting a compensation signal to compensate the characteristics error; and a bias compensation circuit for compensating a bias power applied to the transistor using the compensation bias current and the compensation signal to output the compensated bias power. The present invention is capable of improving the performance of the transistor.

15 Claims, 6 Drawing Sheets

BIAS CONTROLLING APPARATUS

CROSS-REFERENCE TO RELATED APPLICATIONS

Claim and incorporate by reference domestic priority application and foreign priority application as follows:

"CROSS REFERENCE TO RELATED APPLICATION

This application claims the benefit under 35 U.S.C. Section 119 of Korean Patent Application Serial No. 10-2011-0099225, entitled filed Sep. 29, 2011, which is hereby incorporated by reference in its entirety into this application."

BACKGROUND OF THE INVENTION

1. Field of the Invention

The present invention relates to a bias controlling apparatus; and, more particularly to a bias controlling apparatus capable of automatically controlling an error of bias power generated during the change of temperature or the manufacturing thereof.

2. Description of the Related Art

In general, a power amplifier has been used for transceiving a signal with a wireless in a wireless communication system such as a mobile communication terminal. Herein, the power amplifier means a device to supply a load through an antenna by efficiently amplifying a fine signal into a large signal with a small distortion.

Since such power amplifier includes a CMOS power amplifier designed by a GaAs process as a special semiconductor and a commercial CMOS process, the CMOS power amplifier can be mass-produced, be cheap in production cost and have various application fields.

Meanwhile, a power controller of the power amplifier has been developed in order to stably control the operation of the power amplifier, and various technologies have been studied and developed in order to further stably supply the power to the power amplifier using the power controller.

A conventional power amplifying system includes a voltage controller to supply a constant voltage corresponding to a reference voltage to the power amplifier, a current controller to control a driving current according to the inputted control voltage and a bias controller to control a bias power applied to the power amplifier by using the driving voltage and the driving current, wherein a stable current is supplied to the power amplifier by appropriately controlling the bias power according to the inputted control voltage.

However, although the characteristics of the power amplifier cannot be changed since the power amplifier performs an amplification of power in an appropriate operation region at a normal temperature, if the temperature is changed, the characteristics of the power amplifier becomes changed according to the temperature; and, therefore, there occurs a problem such as a deterioration of performance.

More specifically, since the operation characteristics of the power amplifier is sensitively changed according to the change of the applied bias power, the bias power may be easily changed due to the temperature change or the process change during the manufacturing thereof.

Accordingly, although the performance of the power amplifier is improved by controlling the bias power applied to the power amplifier, since a compensation circuit to control the applied bias power does not exist in the prior art, there is a problem to degrade the characteristics of the power amplifying system.

Therefore, there has been required for a method capable of appropriately controlling the bias power of the power amplifier which can be varied due to the temperature change or the process change during the manufacturing processes.

SUMMARY OF THE INVENTION

The present invention has been invented in order to overcome the above-described problems and it is, therefore, an object of the present invention to provide a bias controlling apparatus capable of automatically controlling an error of bias power generated due to the change of temperature or the process changes during the manufacturing thereof.

In accordance with one aspect of the present invention to achieve the object, there is provided a bias controlling apparatus including: a temperature compensation circuit for generating a digital signal corresponding to a temperature of a transistor and outputting a compensation bias current obtained by adding a control current to a reference bias current or by subtracting the control signal from the reference bias current using the generated digital signal; a characteristics compensation circuit for detecting a characteristics error of a mirror transistor connected to the transistor in parallel and for outputting a compensation signal to compensate the characteristics error; and a bias compensation circuit for compensating a bias power applied to the transistor using the compensation bias current and the compensation signal to output the compensated bias power.

Herein, the temperature compensation circuit includes: a temperature detection unit for detecting a temperature voltage corresponding to the temperature; a conversion unit for converting the detected temperature voltage into a digital signal to thereby generate the digital signal; and a current control unit for outputting the compensation bias current by adding the control current to the reference bias current or by subtracting the control signal from the reference bias current according to the converted digital signal.

Also, the temperature compensation circuit further includes a reference voltage generation unit for generating a first reference voltage and outputting the generated first reference voltage to the conversion unit.

At this time, the conversion unit includes: a plurality of comparators for comparing the first reference voltage to the temperature voltage according to a period divided by each temperature and outputting comparison signals respectively based on the comparison results; and a generator for generating the digital signal by combining the plurality of comparison signals.

And, the current control unit includes: a control signal output unit for outputting a temperature control signal by using the generated digital signal; a reference bias generator for controlling in such a way that the reference bias current flows; and a current control unit, connected to the reference bias generator in parallel, for controlling in such a way that the control current is added to the reference bias current or the control signal is subtracted from the reference bias current according to the temperature control signal.

Herein, the current control unit includes: a plurality of current sources connected in series to a power voltage VDD; a plurality of switches connected to the plurality of current sources in series and selectively connected according to the temperature control signal.

More specifically, the current control unit adds the control current to the reference bias current by selectively connecting a switch placed adjacent to the power voltage.

And also, the current control unit subtracts the control current from the reference bias current by selectively connecting a switch placed adjacent to a ground.

Meanwhile, the characteristics compensation circuit includes a characteristics comparator for comparing a voltage of the mirror transistor to a predetermined second reference voltage and for detecting the characteristics error based on the compared results.

In addition, the characteristics compensation circuit generates a compensation signal to compensate the characteristics error by using the detected characteristics error and further includes a feedback control unit for outputting the compensation signals to the mirror transistor and the transistor, respectively.

In addition, the characteristics comparator and the feedback control unit detect the characteristics errors until the voltage of the mirror transistor becomes equal to the second reference voltage and repeat the operation to output the compensation signal.

Also, the characteristics compensation circuit further includes a current mirror unit for mirroring the current flowing into the mirror transistor; and the characteristics comparator compares a voltage corresponding to the current mirrored in the current mirror unit with the second reference voltage.

At this time, the mirror transistor is the same structure of the transistor; and has a size smaller than the transistor.

More specifically, the mirror transistor has a 1/m size of the transistor when a size of the transistor is m.

And, the transistor may be a power amplifier.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

The terms or words used in the present specification and claims should not be interpreted as being limited to typical or dictionary meanings, but should be interpreted as having meanings and concepts relevant to the technical spirit of the present invention based on the rule according to which an inventor can appropriately define the concept of the term to describe his/her own invention in the best manner.

Therefore, configurations shown in embodiments and the drawings of the present invention rather are examples of the most exemplary embodiment and do not represent all of the technical spirit of the invention. Thus, it will be understood that various equivalents and modifications that replace the configurations are possible when filing the present application.

Hereinafter, the embodiments of the present invention will be described in detail with reference to the accompanying drawings.

Figure 1:
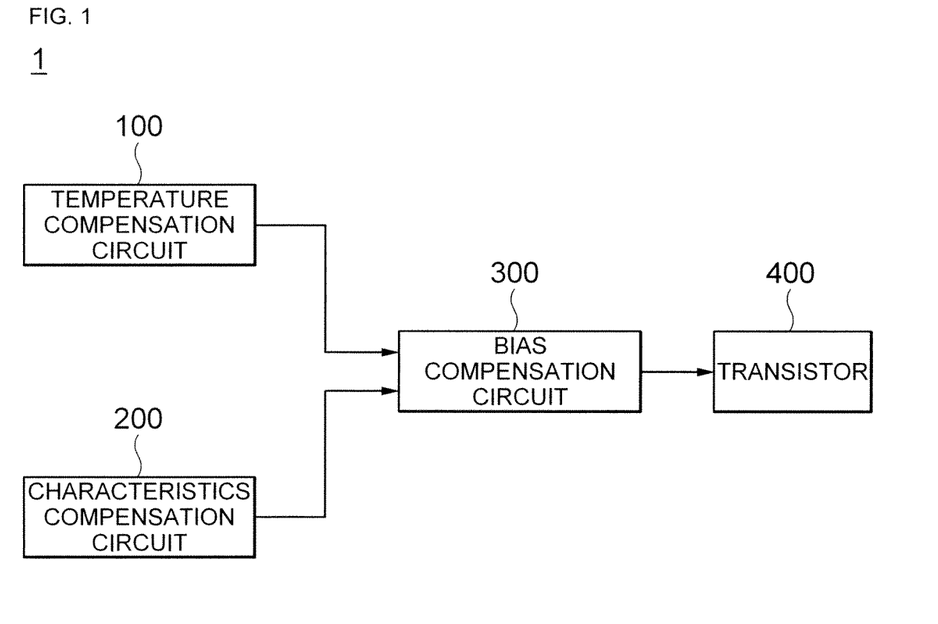
FIG. 1 is a schematic construction diagram showing a bias controlling apparatus in accordance with one embodiment of the present invention.
Figure 2:
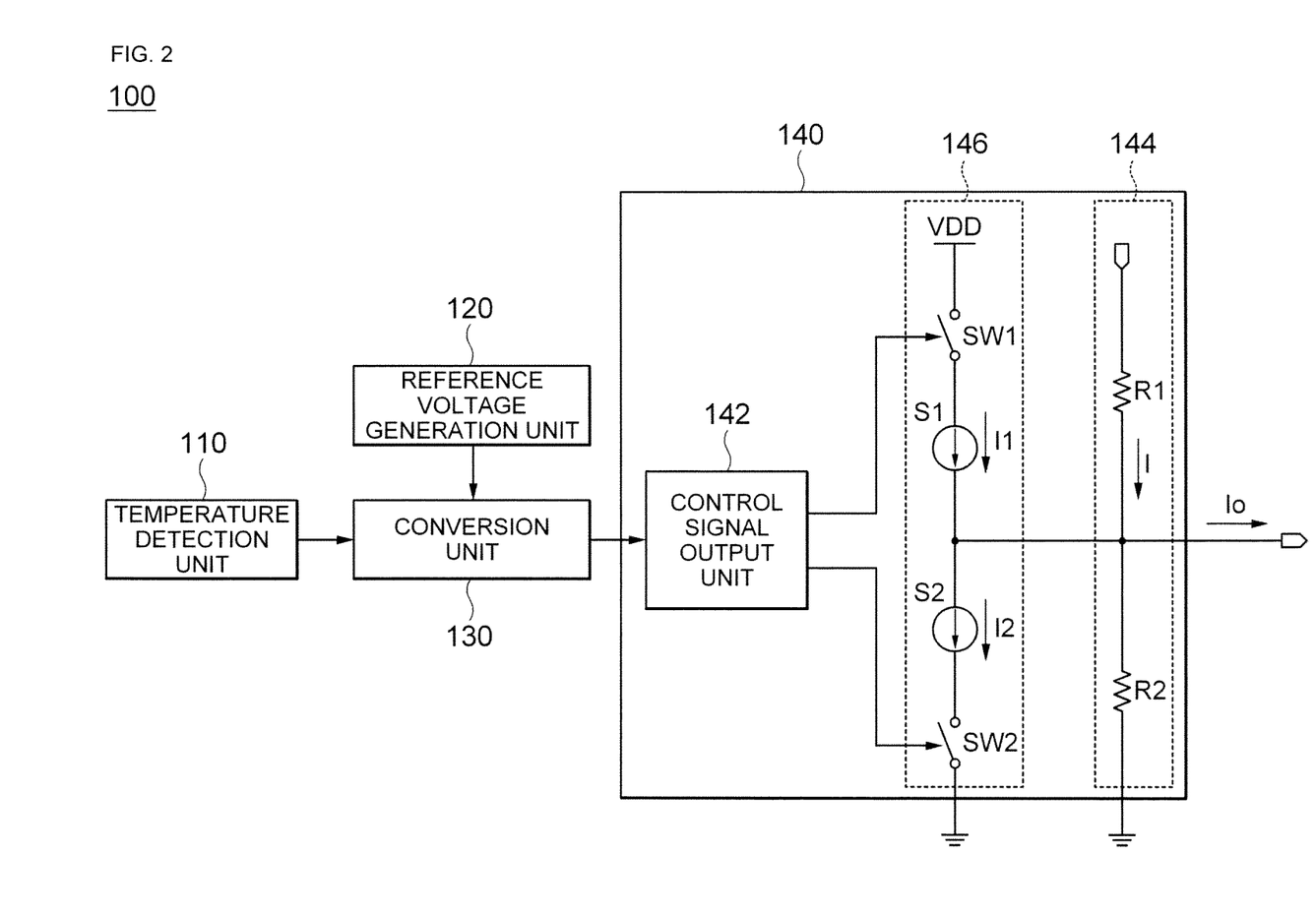
FIG. 2 is a construction diagram showing a temperature compensation circuit shown in FIG. 1.

FIG. 1 is a schematic construction diagram showing a bias controlling apparatus in accordance with one embodiment of the present invention and FIG. 2 is a construction diagram showing a temperature compensation circuit shown in FIG. 1.

As shown in FIG. 1 and FIG. 2, the bias controlling apparatus 1 includes a temperature compensation circuit 100, a characteristics compensation circuit 200 and a bias compensation circuit 300.

At first, before explaining the construction elements of the bias controlling apparatus 1 in detail, the bias controlling apparatus 1 will be explained briefly; and, as the bias controlling apparatus generally means an apparatus to control a bias power applied to a transistor 400, if the transistor 400 constitutes a power amplifier, the bias controlling apparatus 1 can play a role of controlling the bias power of the power amplifier by being installed in a power amplifying system.

However, the bias controlling apparatus is not limited to this, but it can be applied to various systems.

Hereinafter, referring to FIG. 2, the construction element of the bias controlling apparatus in accordance with one embodiment of the present invention will be explained in detail.

The temperature compensation circuit 100 generates a digital signal corresponding to the temperature of adjacent environments, i.e., the temperature of the transistor 400, where the transistor is placed, and outputs compensation bias currents Io by adding control currents I1 and I2 to a reference bias current I or subtracting the control currents I1 and I2 from the reference bias current I according to the generated digital signal.

The above-described temperature compensation circuit 100 can include a temperature detection unit 110, a reference generation unit 120, a conversion unit 130 and a current control unit 140, and the temperature detection unit 110 among those can output the temperature voltage corresponding to the temperature of a current transistor 40 in order to detect the change of temperature. Explaining once more, the temperature detection unit 110 can detect the temperature of adjacent environments where the transistor 400 is placed as a voltage not a concept of degree ° C.

The reference voltage generation unit 120 generates a first reference voltage Vref1 and outputs the generated result to the conversion unit 130. The detail construction of the above-described voltage generation unit 120 will be further described in detail.

The conversion unit 130 can play a role of converting the temperature of transistor 400, i.e., the temperature of the transistor 400, where the transistor is placed, into the digital signal.

Figure 3:
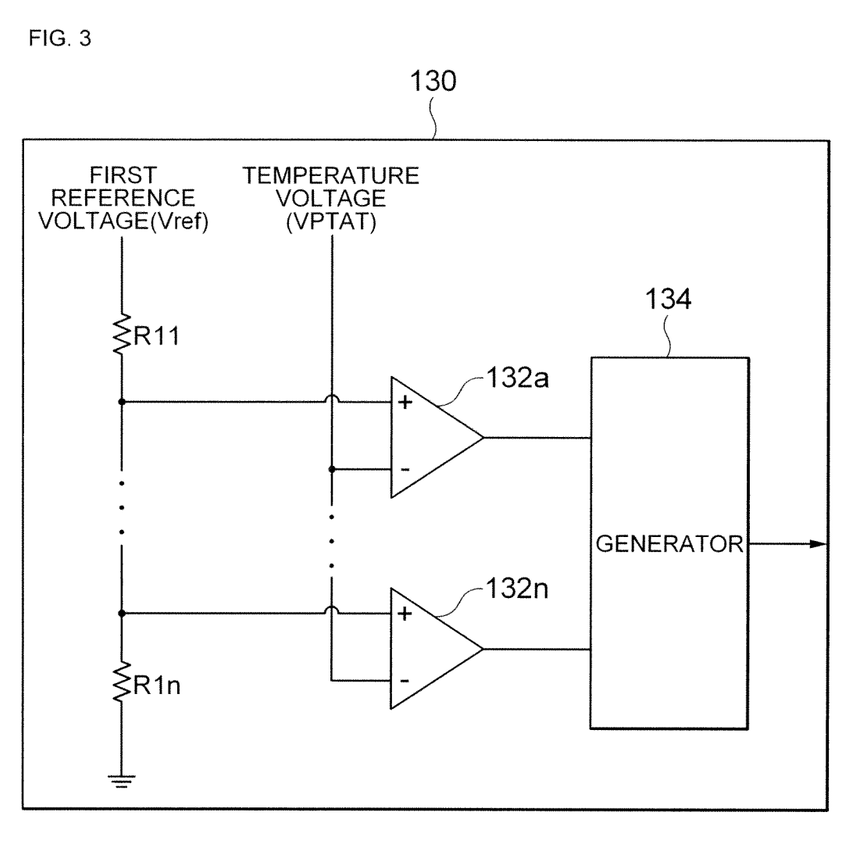
FIG. 3 is a detail construction diagram showing a conversion unit shown in FIG. 2.

As FIG. 3 is a detail construction diagram showing the conversion unit shown in FIG. 2, explaining more specifically with reference to FIG. 3, the conversion unit 130 can include a plurality of comparators 132a~132n and a generator 134.

The plurality of comparators 132a~132n among those can compare the first reference voltage Vref1 to the temperature voltage VPAT according to a period divided by each temperature and output the plurality of comparison signals to the generator 134 using the comparison results.

Explaining further specifically, the plurality of comparators 132a~132n divide the period according to the temperature; each of the first reference voltages Vref1 is compared to the temperature voltage VPTAT according to the divided periods; in the compared results, if the temperature voltage VPTAT is smaller than the first reference voltage Vref1, a comparison signal with a high level can be outputted; and on the contrary if the temperature voltage VPTAT is above the first reference voltage Vref1, a comparison signal with a low level can be outputted.

Herein, as the first reference voltage Vref1 is a voltage applied to each of the plurality of comparison resistors R11~R1n, respectively, the first reference voltages Vref1 different from each other can be applied to the plurality of comparators 132a~132n according to the values of the comparison resistors R11~R1n.

Thereafter, the generator 134 can generate a digital signal by combining a plurality of comparison signals outputted from each of the plurality of comparators 132a~132n.

For example, in case when the plurality of comparators are constituted of the first to third comparators 132a~132n as 3 number of comparators, if a comparison signal of a high level, a comparison signal of a high level and a comparison signal of a low level are outputted from the first to third comparators 132a~132n, respectively, the generator 134 can generate the digital signal, i.e., a binary number of "110", by combining these.

On the other hand, referring back to FIG. 2, the current control unit 140 outputs a compensation bias current Io by adding a control current I1 or I2 to the reference bias current I or subtracting the control current I1 or I2 from the reference bias current I according to the digital signal converted in the conversion unit 130.

The current control unit 140 can include a control signal output unit 142, a reference bias generator 144 and a current controller 146. The control signal output unit 142 outputs a temperature control signal using the digital signal generated in the generator 134. In other words, the control signal output unit 142 can generate and output the temperature control signal to control the current control unit 146 by using the digital signal generated in the generator 134.

The reference bias generator 144 controls so as to flow the reference bias current I by including the plurality of bias resistors R1 and R2.

The current controller 146 is connected to the reference bias generator 144 in parallel as a means to control in such a way that the control current I1 or I2 is added to the reference bias current I or the control current I1 or I2 is subtracted from the reference bias current I according to the temperature control signal. The current controller 146 can be constituted of a plurality of switches SW1 and SW2 to control the plurality of current sources S1 and S2 and a plurality of current sources S1 and S2.

Herein, the plurality of current sources S1 and S2 can be connected in series to the power voltage VDD and a plurality of contact points between the plurality of current sources S1 and S2 and the plurality of contact points between the plurality of bias resistors R1 and R2 can be connected to each other.

And also, the plurality of switches SW1 and SW2 can be selectively connected according to the temperature control signal by being connected to the plurality of current sources S1 and S2.

Hereinafter, the operation process of the switches for adding the control current to the reference bias current or subtracting the control current from the reference bias current in the current controller will be further explained in detail.

Figure 4A:
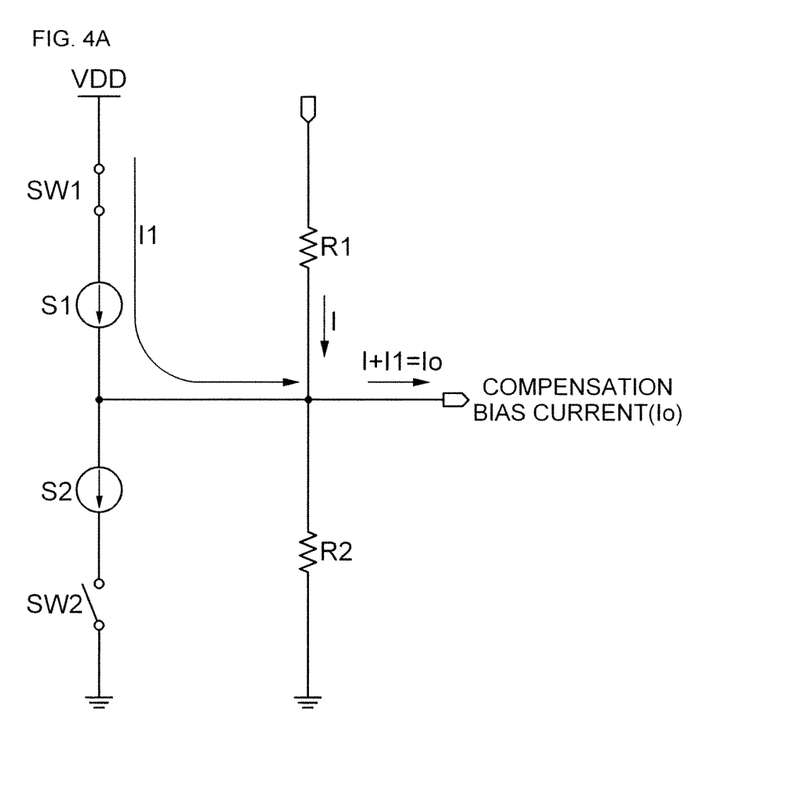
FIG. 4a is a diagram showing an operation process of a switch to add a control current to a reference bias current in the current control unit shown in FIG. 2.
Figure 4B:
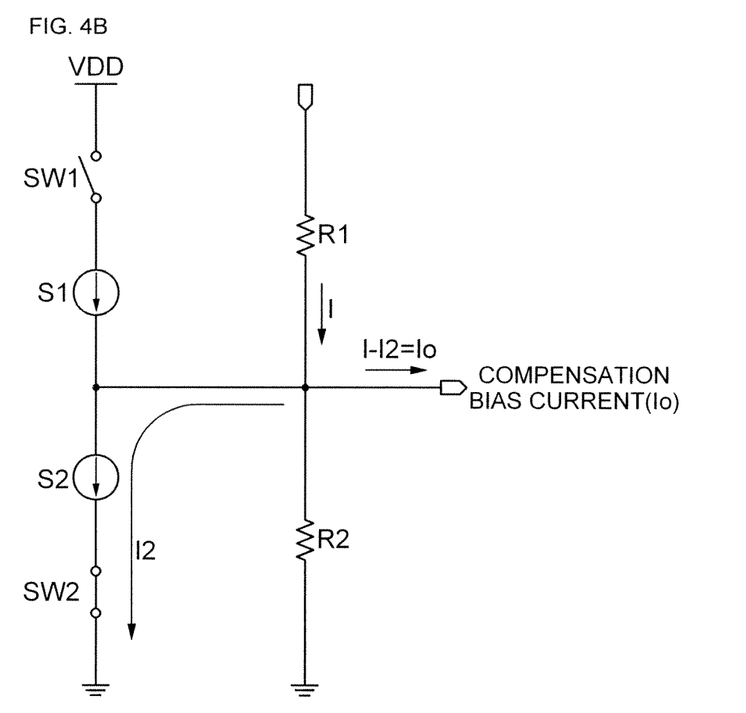
FIG. 4b is a diagram showing an operation process of a switch to subtract a control current from a reference bias current in the current control unit shown in FIG. 2.

FIG. 4a is a diagram showing an operation process of a switch to add a control current to a reference bias current in the current controller shown in FIG. 2; and FIG. 4b is a diagram showing an operation process of a switch to subtract a control current from a reference bias current in the current control unit shown in FIG. 2.

Referring to FIG. 4a, the current controller 146 can add the first control current I1 to the reference bias current I by connecting the first switch SW1 placed adjacent to the power voltage VDD. In other word, the current controller 146 can set the compensation bias current Io higher than the previously set reference gate bias current by adding the first control current I1 applied from the first current source S1 to the reference bias current I by being selectively connected to the first switch SW1 placed adjacent to the power voltage VDD according to the temperature control signal.

Referring to FIG. 4b, the current controller 146 can subtract the second control current I2 from the reference bias current I by connecting the second switch SW2 placed adjacent to the ground GND. In other word, the current controller 146 can set the compensation bias current Io lower than a reference gate bias current by subtracting the second control current I2 applied from the second current source S2 to the reference bias current I by selectively connecting the second switch SW2 placed adjacent to the ground GND according to the temperature control signal.

Accordingly, the temperature compensation circuit 100 can further effectively compensate the bias power by controlling the bias current low or high according to the change of temperature.

Hereinafter, the characteristics compensation circuit in accordance with one embodiment of the present invention will be explained.

Figure 5:
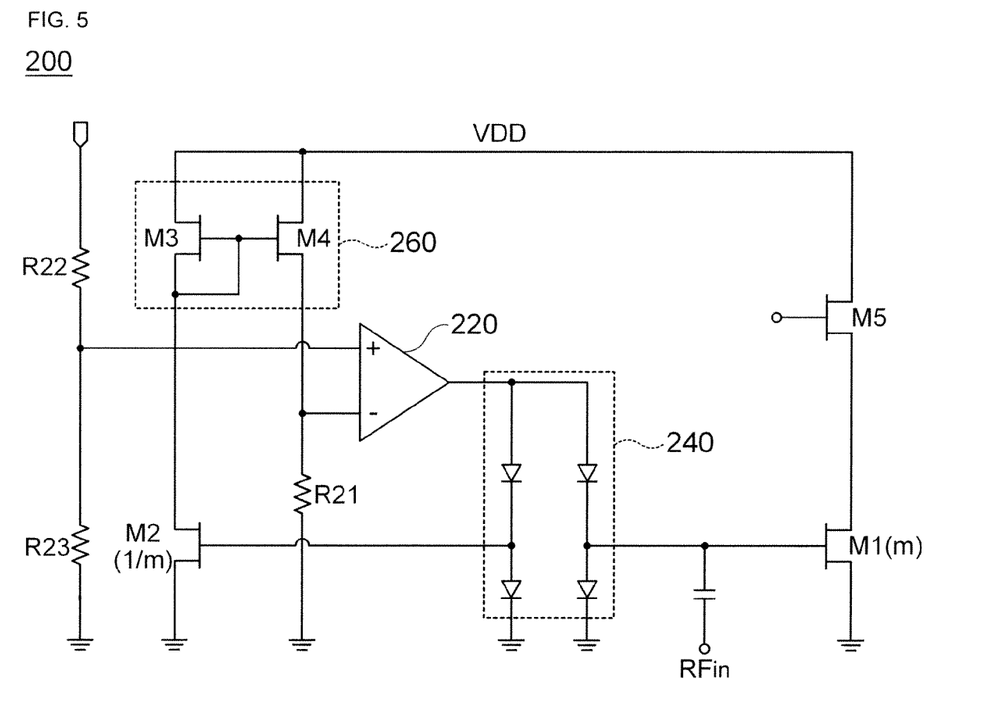
FIG. 5 is a construction diagram showing a characteristics compensation circuit shown in FIG. 1.

FIG. 5 is a construction diagram showing a characteristics compensation circuit shown in FIG. 1. Referring to FIG. 5, the characteristics compensation circuit 200 can detect the characteristics error of a mirror transistor M2 connected to a transistor 400, i.e., M1, in parallel, and include a characteristics comparison unit 220, a feedback control unit 240 and a current mirror unit 260 as a means for outputting the compensation signal to compensate the characteristics error.

At first, explaining the characteristics error before explaining the characteristics compensation circuit 200, the characteristics error can be generated due to the change of transconductance Gm or the change of threshold voltage Vth during the design of general transistor M1. Accordingly, since the characteristics error of the transistor M1 must be compensated, a method for directly detecting the characteristics error in the transistor M1 has a problem of deteriorating the characteristics or consuming power largely.

Therefore, one embodiment of the present invention has the same structure of the transistor M1 and can detect the characteristics error of the transistor M1 by using the mirror transistor M2 having the total size smaller than that of the transistor M1.

If, in case when the transistor M1 is a size of m, it is preferable that the mirror transistor M2 is the 1/m size of the transistor M1, since the mirror transistor M2 generates the same characteristics error of the transistor M1, the characteristics error of the transistor M1 can be compensated by detecting the characteristics error of the mirror transistor M2 at first.

In order to compensate the characteristics error of such transistor, the characteristics comparison unit 220 detects the characteristics error based on the compared result by comparing the previously set second reference voltage Vref2 to the mirror transistor M2.

And then, the feedback control unit generates the compensation signal for compensating the characteristics error by using the characteristics error detected in the characteristics comparison unit 220 and outputs the compensation signal to the mirror transistor M2 and the transistor M1, respectively.

More specifically, the characteristics comparison unit 220 and the feedback control unit 240 detect the characteristics error until the voltage of the mirror transistor M2 is equal to the second reference voltage Vref2 and perform the operation of outputting the compensation repeatedly.

For example, if the voltage of the mirror transistor M2 is changed by the change of processes, there occurs an error in the characteristics of the mirror transistor M2 and the characteristics comparison unit 220 can detect the characteristics error of the mirror transistor M2 by the comparison operation. And then, the feedback control unit 240 generates the compensation signal for compensating the characteristics error by using the characteristics error detected in the characteristics comparison unit 220 and controls in such a way that the voltage of the mirror transistor M2 becomes equal to the second reference voltage Vref2 by outputting the compensation signal to the mirror transistor M2 and the transistor M1, respectively.

At this time, the characteristics error can be also compensated finally in the transistor M1 by transmitting the compensation signal to the mirror transistor M2 together with the transistor M1.

And, the characteristics compensation circuit 200 can further include a current mirror unit 260 to play a role of mirroring the current flowing into the mirror transistor M2 for detecting the voltage of the mirror transistor M2.

Accordingly, the characteristics comparison unit 220 can compare the second reference voltage Vref2 to the mirror transistor M2 corresponding to the current mirrored in the current mirror unit 260.

Finally, referring to FIG. 1, the bias compensation circuit 300 compensates the bias power applied to the transistor 400 by using the compensation bias current and the compensation signal and outputs the compensated result.

That is, the bias compensation circuit 300 can improve the performance thereof by compensating the bias power applied to the transistor 400 by using the compensation signal and the compensation bias current outputted from the temperature compensation circuit 100 and the characteristics compensation circuit 200, respectively, and can be always operated in an optimum operation characteristics.

According to the above-described bias controlling apparatus in accordance with one embodiment of the present invention, it can improve the performance of the transistor by automatically compensating the bias power applied to the transistor according to the errors generated due the temperature change or the process change during the manufacture thereof.

More specifically, the present invention can overcome the problems that the deterioration of performance can be generated due to the operation characteristics change of the transistor, for example, a power amplifier, since the bias power is changed according to the error generated due to the temperature change or the process change during the manufacture thereof and can allow the transistor to be operated at an optimum operation characteristics always by automatically compensating the bias power of the transistor.

Accordingly, the present invention can have advantages capable of improving the reliability of the transistor and the power amplifying system including the same.

While the invention has been described in detail with reference to preferred embodiments thereof, it will be appreciated by those skilled in the art that various changes and modifications may be made in these embodiments without departing from the scope of the invention.

What is claimed is:

1. A bias controlling apparatus comprising:
   a temperature compensation circuit for generating a digital signal corresponding to a temperature of a transistor and outputting a compensation bias current obtained by adding a control current to a reference bias current or by subtracting the control signal from the reference bias current using the generated digital signal;
   a characteristics compensation circuit for detecting a characteristics error of a mirror transistor connected to the transistor in parallel and for outputting a compensation signal to compensate the characteristics error; and
   a bias compensation circuit for compensating a bias power applied to the transistor using the compensation bias current and the compensation signal to output the compensated bias power.

2. The bias controlling apparatus according to claim 1, wherein the temperature compensation circuit includes:
   a temperature detection unit for detecting a temperature voltage corresponding to the temperature;
   a conversion unit for converting the detected temperature voltage into a digital signal to thereby generate the digital signal; and
   a current control unit for outputting the compensation bias current by adding the control current to the reference bias current or by subtracting the control signal from the reference bias current according to the converted digital signal.

3. The bias controlling apparatus according to claim 2, the temperature compensation circuit further comprises a reference voltage generation unit for generating a first reference voltage and outputting the generated first reference voltage to the conversion unit.

4. The bias controlling apparatus according to claim 3, wherein the conversion unit includes:
   a plurality of comparators for comparing the first reference voltage to the temperature voltage according to a period divided by each temperature and outputting comparison signals respectively based on the comparison results; and
   a generator for generating the digital signal by combining the plurality of comparison signals.

5. The bias controlling apparatus according to claim 2, wherein the current control unit includes:
   a control signal output unit for outputting a temperature control signal by using the generated digital signal;
   a reference bias generator for controlling in such a way that the reference bias current flows; and
   a current control unit, connected to the reference bias generator in parallel, for controlling in such a way that the control current is added to the reference bias current or the control signal is subtracted from the reference bias current according to the temperature control signal.

6. The bias controlling apparatus according to claim 5, wherein the current control unit includes:
   a plurality of current sources connected in series to a power voltage VDD;

a plurality of switches connected to the plurality of current sources in series and selectively connected according to the temperature control signal.

7. The bias controlling apparatus according to claim 6, wherein the current control unit adds the control current to the reference bias current by selectively connecting a switch placed adjacent to the power voltage.

8. The bias controlling apparatus according to claim 6, wherein the current control unit subtracts the control current from the reference bias current by selectively connecting a switch placed adjacent to a ground.

9. The bias controlling apparatus according to claim 1, wherein the characteristics compensation circuit includes a characteristics comparator for comparing a voltage of the mirror transistor to a predetermined second reference voltage and for detecting the characteristics error based on the compared results.

10. The bias controlling apparatus according to claim 9, wherein the characteristics compensation circuit generates a compensation signal to compensate the characteristics error by using the detected characteristics error and further includes a feedback control unit for outputting the compensation signals to the mirror transistor and the transistor, respectively.

11. The bias controlling apparatus according to claim 10, wherein the characteristics comparator and the feedback control unit detect the characteristics errors until the voltage of the mirror transistor becomes equal to the second reference voltage and repeat the operation to output the compensation signal.

12. The bias controlling apparatus according to claim 9, wherein the characteristics compensation circuit further includes a current mirror unit for mirroring the current flowing into the mirror transistor; and the characteristics comparator compares a voltage corresponding to the current mirrored in the current mirror unit with the second reference voltage.

13. The bias controlling apparatus according to claim 1, wherein the mirror transistor is the same structure of the transistor; and has a size smaller than the transistor.

14. The bias controlling apparatus according to claim 3, wherein the mirror transistor has a 1/m size of the transistor when a size of the transistor is m.

15. The bias controlling apparatus according to claim 1, wherein the transistor is a power amplifier.

\* \* \* \* \*